(12) United States Patent  
Xing

(10) Patent No.: US 10,514,569 B2  
(45) Date of Patent: Dec. 24, 2019

(54) ARRAY SUBSTRATE, DISPLAY PANEL AND DISPLAY DEVICE

(71) Applicant: Wuhan China Star Optoelectronics Technology Co., Ltd., Wuhan, Hubei (CN)

(72) Inventor: Zhenzhou Xing, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 48 days.

(21) Appl. No.: 15/561,063

(22) PCT Filed: Sep. 21, 2017

(86) PCT No.: PCT/CN2017/102540  
§ 371 (c)(1),  
(2) Date: Sep. 24, 2017

(87) PCT Pub. No.: WO2019/019314  
PCT Pub. Date: Jan. 31, 2019

(65) Prior Publication Data  
US 2019/0025636 A1 Jan. 24, 2019

(30) Foreign Application Priority Data  
Jul. 24, 2017 (CN) .......................... 2017 1 0607326

(51) Int. Cl.  
*G02F 1/1335* (2006.01)  
*H01L 27/12* (2006.01)  
(Continued)

(52) U.S. Cl.  
CPC ...... *G02F 1/133514* (2013.01); *G02F 1/1368* (2013.01); *G02F 1/136213* (2013.01);  
(Continued)

(58) Field of Classification Search  
CPC ......... G02F 1/133514; G02F 1/136213; G02F 1/136286; G02F 1/1368; G02F 2201/121; G02F 2201/123; H01L 27/124  
(Continued)

(56) References Cited

U.S. PATENT DOCUMENTS 8,810,756 B2 * 8/2014 Nakagawa ........ G02F 1/133514  
349/108  
9,286,820 B2 * 3/2016 Chang ...................... G09G 3/20  
(Continued)

FOREIGN PATENT DOCUMENTS

CN 102749751 A 10/2012  
CN 104701354 A 6/2015  
CN 106023819 A 10/2016

*Primary Examiner* — Hoan C Nguyen  
(74) *Attorney, Agent, or Firm* — Andrew C. Cheng

(57) ABSTRACT

An array substrate, a display panel, and a display device are provided. The array substrate includes a plurality of scanning lines parallel with each other, and a plurality of data lines parallel with each other, the scanning lines being intersected and insulated with the data lines to form a plurality of pixel areas. Each of the pixel areas includes a white sub-pixel and at least one color sub-pixel. Control ends of the white sub-pixel and the at least one color sub-pixel are respectively connected with the corresponding scanning lines, and input ends of the white sub-pixel and the at least one color sub-pixel are respectively connected with the corresponding data lines. Wherein the white sub-pixel includes a first white displaying pixel and a second white displaying pixel, and a voltage divider is connected in series between the first white displaying pixel and the second white displaying pixel.

15 Claims, 3 Drawing Sheets

(51) Int. Cl.
*G02F 1/1368* (2006.01)
*G02F 1/1362* (2006.01)

(52) U.S. Cl.
CPC ...... H01L 27/124 (2013.01); *G02F 1/136286* (2013.01); *G02F 2201/121* (2013.01); *G02F 2201/123* (2013.01)

(58) Field of Classification Search
USPC .......................................................... 349/106
See application file for complete search history.

(56) References Cited

U.S. PATENT DOCUMENTS

| | | |
|---|---|---|
| 9,361,841 B2 | 6/2016 | Liao |
| 9,552,757 B2 | 1/2017 | Phan et al. |
| 9,685,107 B2 * | 6/2017 | Park .................... G09G 3/2003 |
| 2013/0141481 A1 | 6/2013 | Peng et al. |

* cited by examiner

ARRAY SUBSTRATE, DISPLAY PANEL AND DISPLAY DEVICE

BACKGROUND OF THE INVENTION

1. Field of the Invention

The present disclosure relates to display technology, and more particularly to an array substrate, a display panel and a display device.

2. Discussion of the Related Art

Nowadays, a liquid crystal display (LCD) mainly includes a red sub-pixel, a green sub-pixel and a blue sub-pixel to form a pixel dot. The LCD controls the voltages between both ends of each of pixels to control grayscale values in the sub-pixels, therefore displaying color images. However, due that luminous efficiency of the red sub-pixel, the green sub-pixel and the blue sub-pixel is low, the LCD formed by the red sub-pixel, the green sub-pixel and the blue sub-pixel has high consumption and low brightness. Therefore, there is an LCD formed by a red sub-pixel, a green sub-pixel, a blue sub-pixel and a white sub-pixel, to improve the luminous efficiency and the brightness of the LCD. As shown in FIG. 1, FIG. 1 is a schematic view of a conventional array substrate including red, green, blue, white sub-pixels. The array substrate including red, green, blue, white sub-pixels includes a plurality of scanning lines 11 parallel with each other and a plurality of data lines 12. The scanning lines 11 are intersected and insulated with the data lines 12 to form a plurality of pixel areas 13. Each of the pixel areas 13 includes a white sub-pixel and at least one color sub-pixel. Control ends of the white sub-pixel and the at least one color sub-pixel are respectively connected with the corresponding scanning line 11. Input ends of the white sub-pixel and the at least one color sub-pixel are respectively connected with the data line 12. Wherein the scanning line 11 is connected with the control end of the sub-pixel, that is, a gate of a thin film transistor (TFT), and the data line 12 is connected with the input end of the sub-pixel, that is, a drain of the TFT, so as to achieve driving and displaying of the LCD.

However, in the LCD formed by the red, green, blue, white sub-pixels, there is no filter in the white sub-pixel, therefore light loss is low, such that the brightness of the white sub-pixel is greater than that of other sub-pixels. The LCD formed by the red, green, blue, white sub-pixels has problem that pure color becomes darker.

SUMMARY

The present disclosure relates to an array substrate, a display panel and a display device, which improves the brightness of pure color and the problem of color shift in the display device, so as to increase displaying quality.

In one aspect, an array substrate is provided. The array substrate includes a plurality of scanning lines parallel with each other, and a plurality of data lines parallel with each other, the scanning lines being intersected and insulated with the data lines to form a plurality of pixel areas. Each of the pixel areas includes a white sub-pixel and at least one color sub-pixel. Control ends of the white sub-pixel and the at least one color sub-pixel are respectively connected with the corresponding scanning lines, and input ends of the white sub-pixel and the at least one color sub-pixel are respectively connected with the corresponding data lines. Wherein the white sub-pixel is comprised with a first white displaying pixel and a second white displaying pixel arranged next to each other, each of the first and second white displaying pixels includes an electrode which is connected to at least one capacitor in series.

In another aspect, a display panel is provided. The display panel includes a color filter substrate, an array substrate disposed opposite to the color filter substrate, and a liquid crystal layer disposed between the color filter substrate and the array substrate. The array substrate includes a plurality of scanning lines parallel with each other, and a plurality of data lines parallel with each other, the scanning lines being intersected and insulated with the data lines to form a plurality of pixel areas. Each of the pixel areas includes a white sub-pixel and at least one color sub-pixel. Control ends of the white sub-pixel and the at least one color sub-pixel are respectively connected with the corresponding scanning lines, and input ends of the white sub-pixel and the at least one color sub-pixel are respectively connected with the corresponding data lines. Wherein the white sub-pixel is comprised with a first white displaying pixel and a second white displaying pixel arranged next to each other, each of the first and second white displaying pixels includes an electrode which is connected to at least one capacitor in series.

In another aspect, a display device is provided. The display device includes a display panel. The display panel includes a color filter substrate, an array substrate disposed opposite to the color filter substrate, and a liquid crystal layer disposed between the color filter substrate and the array substrate. The array substrate includes a plurality of scanning lines parallel with each other, and a plurality of data lines parallel with each other, the scanning lines being intersected and insulated with the data lines to form a plurality of pixel areas. Each of the pixel areas includes a white sub-pixel and at least one color sub-pixel. Control ends of the white sub-pixel and the at least one color sub-pixel respectively are connected with the corresponding scanning lines, and input ends of the white sub-pixel and the at least one color sub-pixel are respectively connected with the corresponding data lines. Wherein the white sub-pixel is comprised with a first white displaying pixel and a second white displaying pixel arranged next to each other, each of the first and second white displaying pixels includes an electrode which is connected to at least one capacitor in series.

In view of the above, the array substrate of the present disclosure includes red, green, blue, and white sub-pixels. The white sub-pixel includes at least two white displaying pixels. Each of the first and second white displaying pixels includes an electrode which is connected to at least one capacitor in series, so as to reduce the voltage of the corresponding pixel electrode of the white displaying pixel, which decreases the whole brightness of the white sub-pixel, therefore improving the problem of the color shift and the brightness of the pure color in the display device, and improve the displaying quality of the display device.

DETAILED DESCRIPTION OF THE EMBODIMENTS

Among the specification and the scope of subsequent terms are used to refer to specific components. Those of skill in the art will appreciate that manufacturers may use different terms to refer to the same components. The patent specification and subsequent differences in the name of the range is not to be used as a way to distinguish between the components, but with differences in the functional components as distinguished benchmarks. Embodiments of the invention will now be described more fully hereinafter with reference to the accompanying drawings, in which embodiments of the invention are shown.

Figure 1:
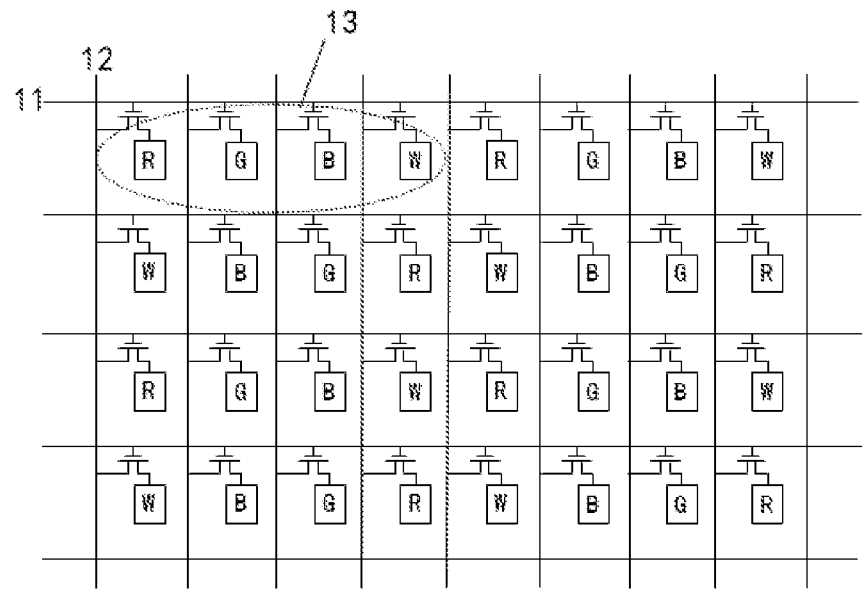
FIG. 1 is a schematic view of a conventional array substrate including red, green, blue, white sub-pixels.
Figure 2:
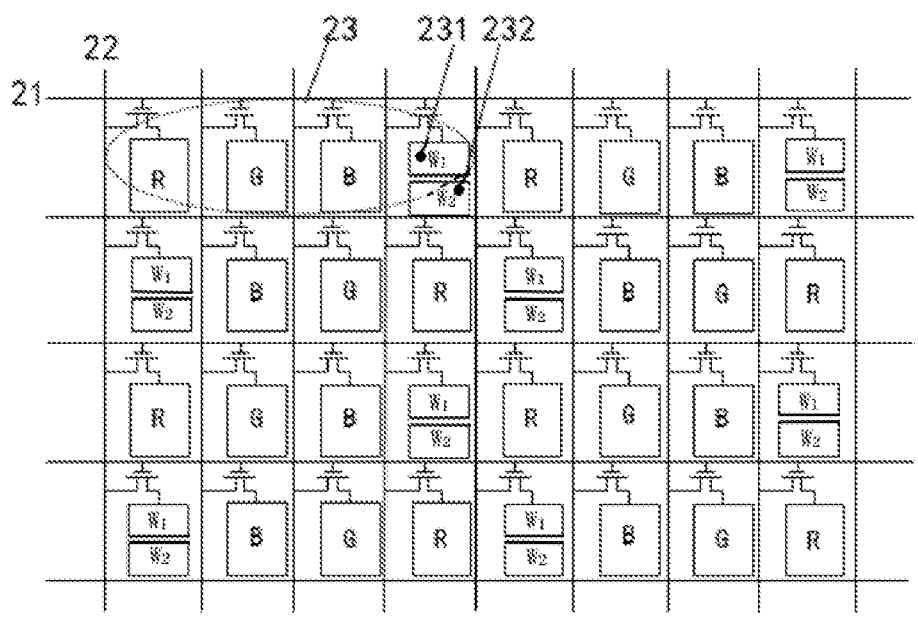
FIG. 2 is a schematic view of an array substrate in accordance with one embodiment of the present disclosure.

FIG. 2 is a schematic view of an array substrate in accordance with one embodiment of the present disclosure. The array substrate includes a plurality of scanning lines 21 parallel with each other, and a plurality of data lines 22 parallel with each other, wherein the number of the scanning lines and the number of the data lines is not specifically limited, and can be modified according to the various situations. The scanning lines 21 are intersected and insulated with the data lines 22 to form a plurality of pixel areas 23. Each of the pixel areas 23 includes a white sub-pixel and at least one color sub-pixel. Control ends of the white sub-pixel and the at least one color sub-pixel are respectively connected with the corresponding scanning line 21, and input ends of the white sub-pixel and the at least one color sub-pixel are respectively connected with the corresponding data line 22. The area of the white sub-pixel and the area of the color sub-pixel are the same.

The white sub-pixel includes a first white displaying pixel and a second white displaying pixel, and each of the first and second white displaying pixels includes an electrode which is connected to at least one capacitor in series. Take a white sub-pixel including a first white displaying pixel $W_1 231$ and a second white displaying pixel $W_2 232$ as an example. The second white displaying pixel $W_2 232$ is connected in series with at least one component, and then is connected in parallel with the first white displaying pixel $W_1 231$. The component is configured to be a voltage divider, which may be a capacitor or other components, and is not specifically limited herein. The number of the voltage divider can be modified according to various situations, and is not limited herein.

In the embodiment, the color sub-pixel includes at least one of a red sub-pixel R, a green sub-pixel G, and a blue sub-pixel B, or includes a combination of a plurality of the same or different color sub-pixels. Wherein the white sub-pixel is disposed adjacent to the color sub-pixel. The white sub-pixel and the color sub-pixel within the same pixel area 23 are connected with the same scanning line 21 or the same data line 22. Specifically, the white sub-pixel and the color sub-pixel are respectively connected with the corresponding scanning line 21, and the white sub-pixel and the color sub-pixel are respectively connected with the corresponding data line 22.

Alternatively, the white sub-pixel further includes a third white displaying pixel or a fourth white displaying pixel, and can be modified according to various situations, and is not limited herein.

In the embodiment, the arrangement of the color sub-pixel and the white sub-pixel is only an exemplary embodiment, and is not limited to the present disclosure. Alternatively, the arrangement of the color sub-pixel and the white sub-pixel may be modified according to various situations, and is not specifically limited herein.

Figure 3:
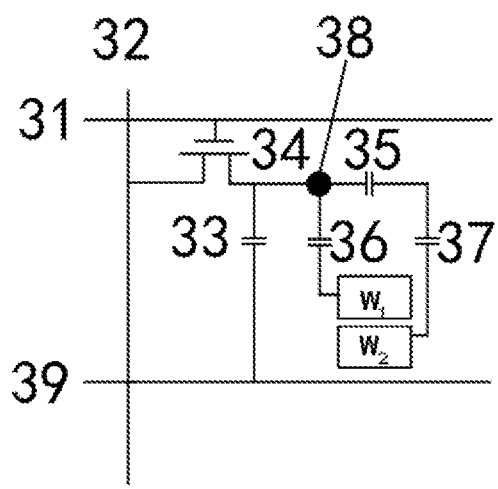
FIG. 3 is a circuit diagram of a white sub-pixel of the array substrate of FIG. 2 in accordance with one embodiment of the present disclosure.

In order to describe clearly that the white sub-pixel includes at least first white displaying pixel and second white displaying pixel, and each of the first and second white displaying pixels includes an electrode which is connected to at least one capacitor in series to improve the problem of color shift and the brightness of pure color in the display device, please refer to FIG. 3. Referring to FIG. 3, FIG. 3 is a circuit diagram of a white sub-pixel of the array substrate of FIG. 2 in accordance with one embodiment of the present disclosure.

As shown in FIG. 3, in the embodiment, the white sub-pixel includes a storage capacitor 33, a pixel capacitor 36, a pixel capacitor 37, and a capacitor 35. One end of the storage capacitor 33 is electrically connected with an output end of a thin film transistor (TFT) 34, and the other end of the storage capacitor 33 is connected with a common electrode 39. The common electrode 39 is disposed on the array substrate. Alternatively, the common electrode 39 may be disposed on the color filter substrate according to different types of the LCDs. One end of the pixel capacitor 36 is electrically connected with an output end of the TFT 34, and the other end of the pixel capacitor 36 is electrically connected with the first white displaying pixel $W_1$. One end of the capacitor 35 is electrically connected with an end 38 formed by the pixel capacitor 36 being electrically connected with the output end of the TFT 34, and the other end of the capacitor 35 is electrically connected with the pixel capacitor 37. The other end of the pixel capacitor 37 is electrically connected with the second white displaying pixel $W_2$ of the white sub-pixel. A gate of the TFT 34 is electrically connected with a scanning line 31, and a drain of the TFT 34 is electrically connected with a data line 32.

The gate of the TFT 34 is input by the specific voltage through the scanning line 31, such that the source and the drain of the TFT 34 is turned on or turned off. When the source and the drain of the TFT 34 are turned on, the grayscale value is input to the corresponding sub-pixel, therefore controlling the brightness of the sub-pixel. In the embodiment, the white sub-pixel is divided into two white displaying pixels, a first white displaying pixel $W_1$ and a second white displaying pixel $W_2$. The second white displaying pixel $W_2$ is connected in series with the capacitor 35, and then is connected in parallel with the first white displaying pixel $W_1$. The electric charge of the second white displaying pixel $W_2$ is less than that of the first white displaying pixel $W_1$ due to the capacitor 35, the brightness of the second white displaying pixel $W_2$ is less than that of the first white displaying pixel $W_1$, so as to decrease the whole brightness of the white sub-pixel.

Figure 4:
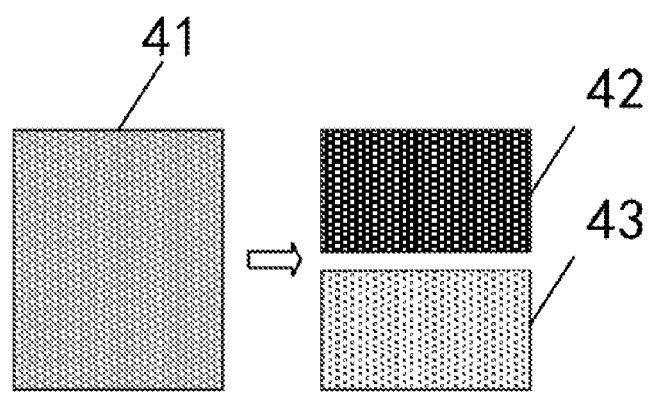
FIG. 4 is a displaying brightness of a white sub-pixel of the array substrate of FIG. 2 in accordance with one embodiment of the present disclosure.

As shown in FIG. 4, FIG. 4 is a display brightness of a white sub-pixel of the array substrate of FIG. 2 in accordance with one embodiment of the present disclosure, wherein color depths only show display brightness. In the embodiment, the brightness of the first white displaying pixel $W_1 42$ is brightest, and the brightness of the second white displaying pixel $W_2 43$ is darkest. Therefore, the whole brightness of the white sub-pixel is between the brightness of the first white displaying pixel $W_1 42$ and the brightness of the second white displaying pixel $W_2 43$.

From the viewing angle, the gamma curves in the first white displaying pixel $W_1 42$ and the second white displaying pixel $W_2 43$ may result in change due to color shift. However, by combining the gamma curves of the first white displaying pixel $W_1 42$ and the second white displaying pixel $W_2 43$, the whole gamma curve is close to gamma 2.2, therefore improving color shift.

The white sub-pixel of the array substrate in the embodiment includes a first white displaying pixel and a second white displaying pixel, and each of the first and second white displaying pixels includes an electrode which is connected to at least one capacitor in series, so as to decrease the voltage of the pixel electrode on the displaying pixel, which decrease the whole brightness of the white sub-pixel, therefore improving the problem of color shift and the brightness of the pure color in the display device, and improving the displaying quality of the display device.

Figure 5:
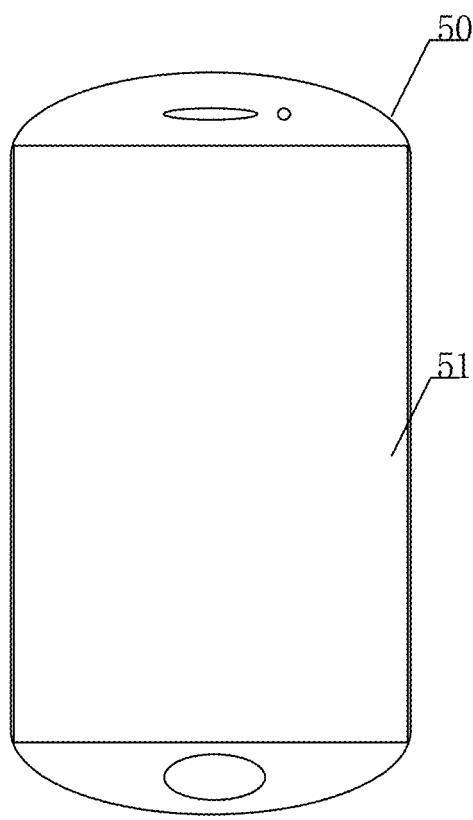
FIG. 5 is a schematic view of a display device in accordance with one embodiment of the present disclosure.

Referring to FIG. 5, FIG. 5 is a schematic view of a display device in accordance with one embodiment of the present disclosure. In the embodiment, the display device 50 includes a display panel 51. The display panel 51 includes the array substrate described in the above embodiments, a color filter substrate disposed opposite to the array substrate, and a liquid crystal layer disposed between the array substrate and the color filter substrate. The structure and operation of the array substrate is described above, and the description is omitted herein.

In the embodiment, the display device 50 may be a smart phone, a tablet, a liquid crystal television, or a computer, and is not limited specifically here.

The white sub-pixel of the array substrate in the embodiment includes a first white displaying pixel and a second white displaying pixel, and each of the first and second white displaying pixels includes an electrode which is connected to at least one capacitor in series, so as to decrease the voltage of the pixel electrode on the displaying pixel, which decrease the whole brightness of the white sub-pixel, therefore improving the problem of color shift and the brightness of the pure color in the display device, and improving the displaying quality of the display device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate, comprising:
a plurality of scanning lines parallel with each other and a plurality of data lines parallel with each other, the scanning lines being intersected and insulated with the data lines to form a plurality of pixel areas; each of the pixel areas comprising a white sub-pixel and at least one color sub-pixel; control ends of the white sub-pixel and the at least one color sub-pixel respectively connecting with the corresponding scanning lines; and input ends of the white sub-pixel and the at least one color sub-pixel respectively connecting with the corresponding data lines;
wherein the white sub-pixel is comprised with a first white displaying pixel and a second white displaying pixel arranged next to each other, each of the first and second white displaying pixels includes an electrode which is connected to at least one capacitor in series.

2. The array substrate as claimed in claim 1, wherein the white sub-pixel and the at least one color sub-pixel are disposed adjacent to each other, and the white sub-pixel and the at least one color sub-pixel within one of the pixel areas are connected with the same scanning line.

3. The array substrate as claimed in claim 1, wherein the at least one color sub-pixel comprises at least one of a red sub-pixel, a green sub-pixel and a blue sub-pixel.

4. The array substrate as claimed in claim 1, wherein the white sub-pixel are connected with the corresponding scanning line and the corresponding data line through at least one oxide thin-film transistor (TFT), and the at least one color sub-pixel are connected with the corresponding scanning line and the corresponding data line through the at least one oxide TFT.

5. The array substrate as claimed in claim 4, wherein the array substrate further comprises a common electrode; wherein the white sub-pixel further comprises a storage capacitor; one end of the storage capacitor is connected with an output end of the oxide TFT, and the other end of the storage capacitor is connected with the common electrode.

6. A display panel, comprising:
a color filter substrate;
an array substrate disposed opposite to the color filter substrate;
a liquid crystal layer disposed between the color filter substrate and the array substrate;
the array substrate comprising a plurality of scanning lines parallel with each other and a plurality of data lines parallel with each other, the scanning lines being intersected and insulated with the data lines to form a plurality of pixel areas; each of the pixel areas comprising a white sub-pixel and at least one color sub-pixel; control ends of the white sub-pixel and the at least one color sub-pixel are respectively connected with the corresponding scanning lines; and input ends of the white sub-pixel and the at least one color sub-pixel are respectively connected with the corresponding data lines;
wherein the white sub-pixel is comprised with a first white displaying pixel and a second white displaying pixel arranged next to each other, each of the first and second white displaying pixels includes an electrode which is connected to at least one capacitor in series.

7. The display panel as claimed in claim 6, wherein the white sub-pixel and the at least one color sub-pixel are disposed adjacent to each other, and the white sub-pixel and the at least one color sub-pixel within one of the pixel areas are connected with the same scanning line.

8. The display panel as claimed in claim 6, wherein the at least one color sub-pixel comprises at least one of a red sub-pixel, a green sub-pixel and a blue sub-pixel.

9. The display panel as claimed in claim 6, wherein the white sub-pixel are connected with the corresponding scanning line and the corresponding data line through at least one oxide thin-film transistor (TFT), and the at least one color sub-pixel are connected with the corresponding scanning line and the corresponding data line through the at least one oxide TFT.

10. The display panel as claimed in claim 9, wherein the array substrate further comprises a common electrode; the white sub-pixel further comprises a storage capacitor; one end of the storage capacitor is connected with an output end of the oxide TFT, and the other end of the storage capacitor is connected with the common electrode.

11. A display device, comprising:
a display panel, the display panel comprising
a color filter substrate;
an array substrate disposed opposite to the color filter substrate;

a liquid crystal layer disposed between the color filter and the array substrate;

the array substrate comprising a plurality of scanning lines parallel with each other and a plurality of data lines parallel with each other, the scanning lines being intersected and insulated with the data lines to form a plurality of pixel areas; each of the pixel areas comprising a white sub-pixel and at least one color sub-pixel; control ends of the white sub-pixel and the at least one color sub-pixel are respectively connected with the corresponding scanning lines; and input ends of the white sub-pixel and the at least one color sub-pixel are respectively connected with the corresponding data lines;

wherein the white sub-pixel is comprised with a first white displaying pixel and a second white displaying pixel arranged next to each other, each of the first and second white displaying pixels includes an electrode which is connected to at least one capacitor in series.

12. The display device, as claimed in claim 11, wherein the white sub-pixel and the at least one color sub-pixel are disposed adjacent to each other, and the white sub-pixel and the at least one color sub-pixel within one of the pixel areas are connected with the same scanning line.

13. The display device, as claimed in claim 11, wherein the at least one color sub-pixel comprises at least one of a red sub-pixel, a green sub-pixel and a blue sub-pixel.

14. The display device, as claimed in claim 11, wherein the white sub-pixel are connected with the corresponding scanning line and the corresponding data line through at least one oxide thin-film transistor (TFT), and the at least one color sub-pixel are connected with the corresponding scanning line and the corresponding data line through the at least one oxide TFT.

15. The display device, as claimed in claim 14, wherein the array substrate further comprises a common electrode; the white sub-pixel further comprises a storage capacitor; one end of the storage capacitor is connected with an output end of the oxide TFT, and the other end of the storage capacitor is connected with the common electrode.

* * * * *